United States Patent [19]
Ritland et al.

[11] Patent Number: 5,700,373
[45] Date of Patent: Dec. 23, 1997

[54] METHOD FOR SEALING A FILTER

[75] Inventors: Marcus A. Ritland, Golden; Dennis W. Readey, Lakewood; Richard N. Kleiner, Englewood; Jack D. Sibold, Golden, all of Colo.

[73] Assignee: Coors Ceramics Company, Golden, Colo.

[21] Appl. No.: 220,558

[22] Filed: Mar. 31, 1994

Related U.S. Application Data

[63] Continuation-in-part of Ser. No. 946,972, Sep. 17, 1992, abandoned.

[51] Int. Cl.$^6$ .............. B01D 35/00; B23K 1/19; B23K 31/02; B23K 103/16
[52] U.S. Cl. .............. 210/323.2; 210/446; 210/497.01; 210/500.1; 55/502; 55/523; 228/128; 228/903
[58] Field of Search .............. 210/510.1, 450, 210/496, 500.1, 497.01, 456, 493.2, 323.2, 446, 500.26; 55/523, DIG. 30, 502; 228/120, 903

[56] References Cited

U.S. PATENT DOCUMENTS

| | | |
|---|---|---|
| 4,069,157 | 1/1978 | Hoover et al. . |
| 4,363,644 | 12/1982 | Sato et al. ............ 55/523 |
| 4,417,908 | 11/1983 | Pitcher, Jr. ............ 210/510.1 |
| 4,894,160 | 1/1990 | Abe et al. ............ 210/510.1 |
| 4,971,696 | 11/1990 | Abe et al. . |
| 4,981,590 | 1/1991 | Van'T Veen et al. . |
| 4,983,423 | 1/1991 | Goldsmith . |
| 5,004,034 | 4/1991 | Park et al. . |
| 5,040,588 | 8/1991 | Newkirk et al. . |
| 5,161,728 | 11/1992 | Li ............ 228/124 |
| 5,203,488 | 4/1993 | Wang et al. . |
| 5,223,138 | 6/1993 | Zievers et al. ............ 55/523 |
| 5,238,045 | 8/1993 | Park et al. . |
| 5,248,079 | 9/1993 | Li ............ 228/121 |
| 5,249,621 | 10/1993 | Aghajanian et al. . |
| 5,401,406 | 3/1995 | Johnson et al. ............ 210/450 |
| 5,415,772 | 5/1995 | Garcera et al. ............ 55/DIG. 30 |

FOREIGN PATENT DOCUMENTS

| 463234 | 1/1992 | European Pat. Off. ............ 210/510.1 |
|---|---|---|

*Primary Examiner*—James Sells
*Assistant Examiner*—Kenneth M. Jones
*Attorney, Agent, or Firm*—Sheridan Ross P.C.

[57] ABSTRACT

A process for sealing a ceramic filter by infiltrating a metal into an end of the filter. The process includes the steps of contacting the end of a porous ceramic filter with a molten metal, whereby the metal enters into the ceramic matrix to substantially fill the void space. The ceramic filter is cooled to form a filter having a ceramic-metal composite portion. The present invention also provides a filter having an infiltrated metal seal.

21 Claims, 2 Drawing Sheets

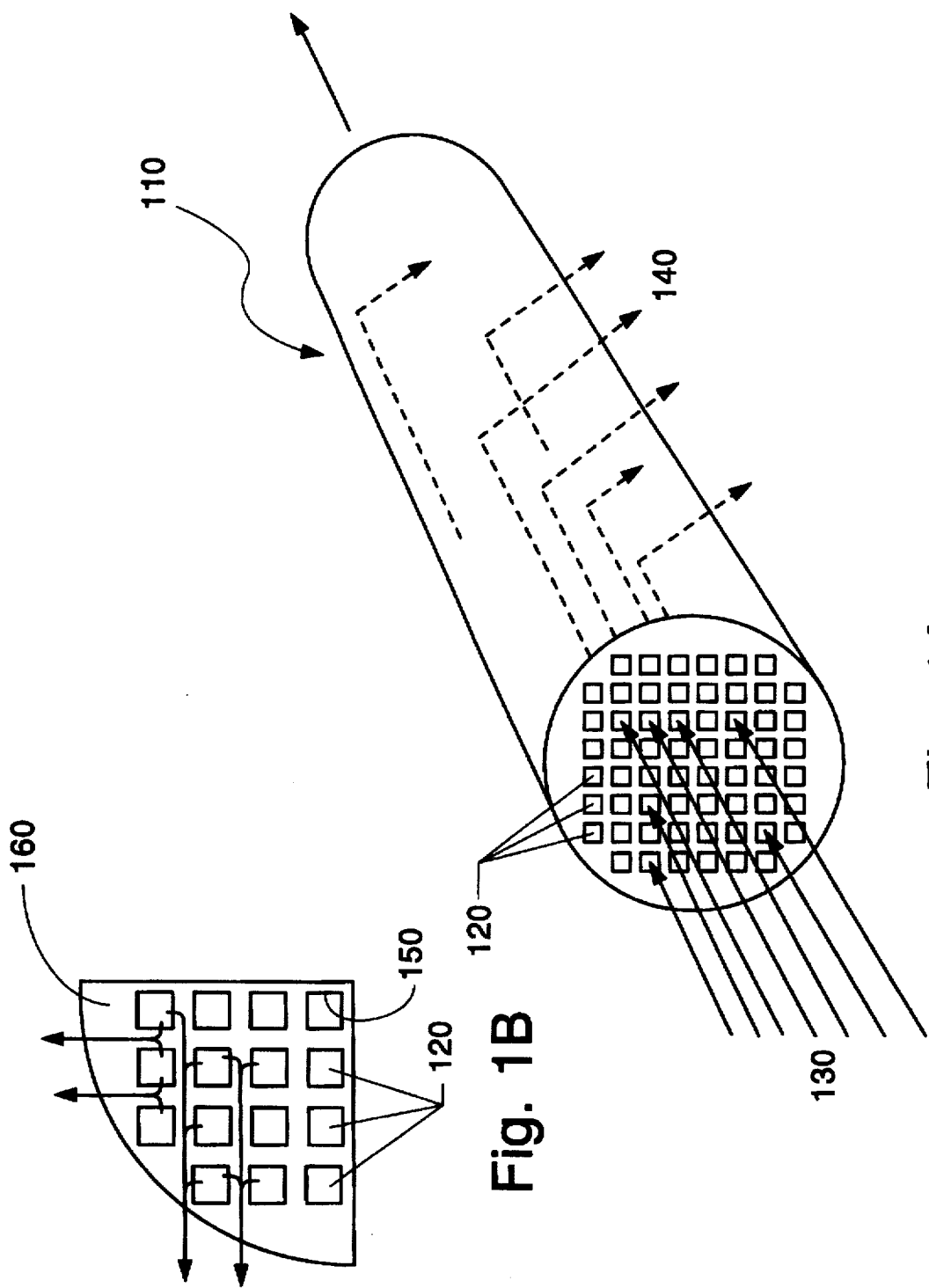

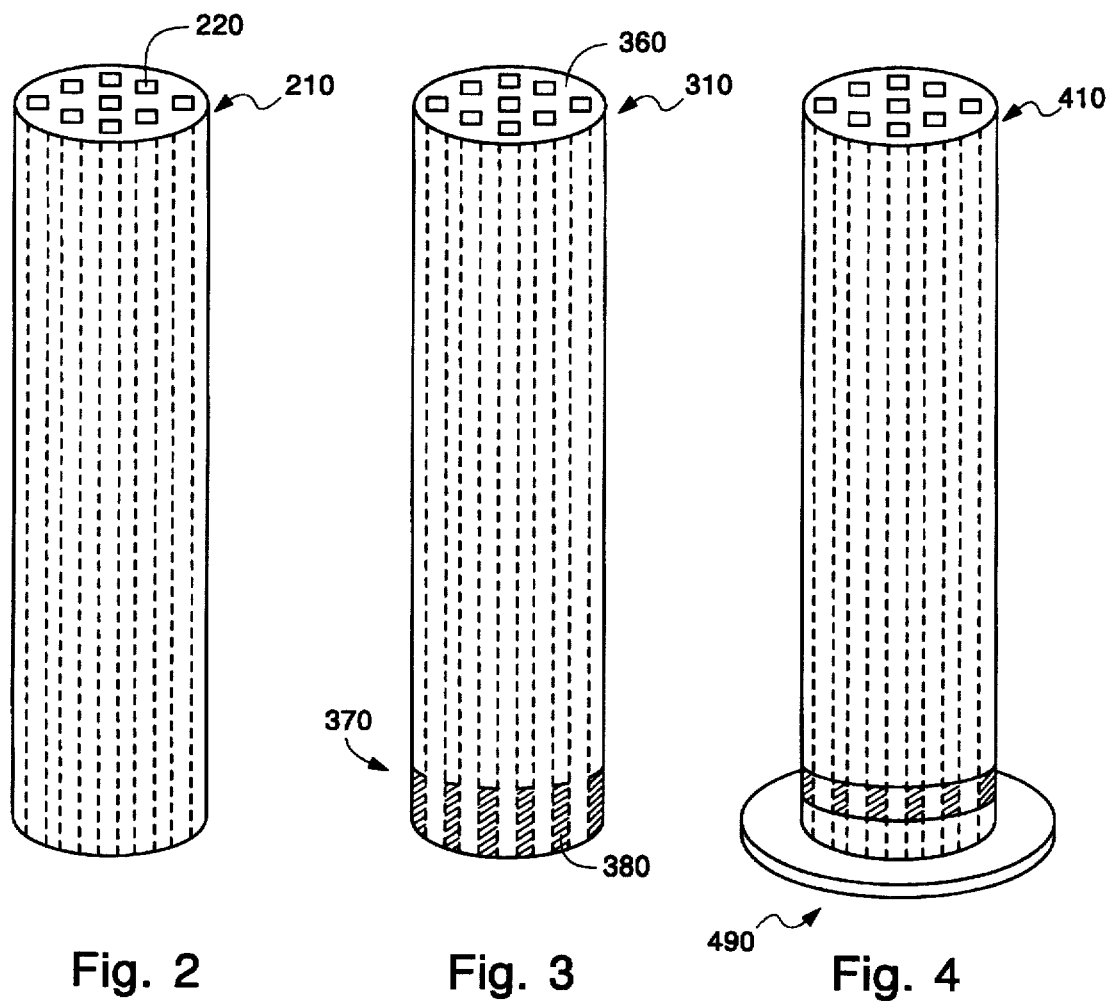

METHOD FOR SEALING A FILTER

This application is a continuation-in-part of Patent Cooperation Treaty application Ser. No. PCT/US93/08835, filed Sep. 17, 1993, which designates the United States and is a continuation-in-part of U.S. patent application Ser. No. 07/946,972, filed Sep. 17, 1992, now abandoned.

BACKGROUND OF THE INVENTION

1. Field of the Invention

The present invention relates to a method for sealing the end of a ceramic filter element. More particularly, the present invention relates to a method for sealing the end of a ceramic filter element by infiltrating metal into a portion of the filter element. The present invention also relates to filter elements produced by infiltrating metal into an end to seal the filter element.

2. Description of Related Art

Filtration devices are used to separate two or more substances from each other on the basis of size, shape or state of the substances. Filtration devices rely upon a pressure differential across a porous membrane for separating the substances. There has been significant interest in a range of filtration devices that can be categorized into the groups ultra-filtration (from about 0.001 to about 0.2 micrometers) and micro-filtration (from about 0.2 to about 10.0 micrometers).

These filtration devices are particularly useful for separating gas streams or liquids. A number of separation methods have been used in the various processing industries. The use of filtration devices having ceramic membranes is a relatively new area. The benefits of ceramic membranes generally include high-temperature capability, resistance to chemicals and good structural integrity which permits the separation membrane to be used under high pressures.

Ceramic membranes can be used for a wide variety of applications. For example, clarifying and sterilizing fruit juices and other liquids in the food and beverage industry; concentrating vaccines and enzymes or purifying amino acids and similar processes in the biotechnology industry; removing hydrogen from refinery streams and carbon dioxide and hydrogen sulfide from natural gas in the gas separation industry; removing precipitated radionuclides and metal oxide particles from waste water; and purifying waters, acids, solvents and similar liquids in the electronic manufacturing industry.

Ceramic-based filter elements have been developed to take advantage of the properties of ceramic materials. For example, a filtration device having a ceramic filter element is disclosed in U.S. Pat. No. 4,069,157 by Hoover et al., which is incorporated herein by reference in its entirety. This patent discloses a filter element fabricated using a porous ceramic support, such as alumina ($Al_2O_3$) or cordierite ($2MgO.2Al_2O_3.5SiO_2$), having a porosity of from about 30 percent to about 60 percent. A ceramic membrane layer is coated onto the interior channels of the porous ceramic support. The opening size in the membrane is controlled and can vary from about 0.002 micrometers up to about 1 micrometer.

Similar filtration devices utilizing ceramic filter elements are disclosed in the prior art. For example, see U.S. Pat. Nos. 4,894,160 and 4,971,696, both by Abe et al.; U.S. Pat. No. 4,983,423 by Goldsmith; or U.S. Pat. No. 4,981,590 by Van Tveen. Each of the foregoing patents is incorporated herein by reference in their entirety.

One of the problems associated with manufacturing filtration devices incorporating ceramic filter elements is the difficulties and limitations relating to sealing the end of the ceramic filter element. At least one end of the filter element must usually be sealed and prepared for installation into a filtration device by sealing the porous support and providing a surface that can easily be attached to the filtration device. Typically, the end of the filter must form a tight seal with a metal component, such as a stainless steel ring, to prevent the pressurized filtrant from bypassing the filter. Most filter elements have been sealed by internally sealing the porous ceramic with a ceramic slurry or cement and using organic materials, such as rubber or polymer "o-rings" to seal around the perimeter of the filter element. The o-rings are typically not capable of functioning in elevated temperatures and under corrosive conditions. Further, the o-rings will not form a tight seal around the ceramic if the perimeter of the ceramic filter element has defects or is "out of round." This is a particularly acute problem when the filter is used to separate materials having very small diameters (e.g. ultrafiltration).

U.S. Pat. No. 5,203,488 by Wang et al. issued on Apr. 20, 1993. This patent is assigned to LANXIDE Technology Co. and is part of a series of patents assigned to LANXIDE Technology Co. that relate to ceramic-metal composites. Wang et al. disclose a method for joining two self-supporting bodies by a reactive infiltration process. It is disclosed that two materials can be bonded together utilizing the composite of the invention. For example, a powdered parent metal and a material which is to be reactively infiltrated can be placed between the two bodies. In an alternative embodiment, it is disclosed that an active brazing material can be placed between two composites formed according to the invention or may be placed between one body formed in accordance with the invention and a second body. It is disclosed that a foil, paste or powder which includes an active brazing alloy is placed between at least two self-supporting bodies made according to the first step of the invention.

SUMMARY OF THE INVENTION

The present invention is generally directed to a method for sealing the end of a ceramic-based filter element.

According to one aspect of the present invention, a method for sealing the end of a ceramic filter element is provided. The method can include the steps of providing a porous ceramic filter element having a first end and a second end and having filtering channels therethrough, contacting a portion of the first end of the filter element with a molten metal to infiltrate the metal into the first end of the filter element and cooling the infiltrated portion to form a filter element having a sealed end comprising a ceramic-metal composite portion.

According to certain embodiments of this aspect of the invention, the method can include the step of attaching a metal seal ring to the ceramic-metal composite portion. The step of attaching a metal seal ring to the ceramic-metal composite portion can include the step of brazing a seal ring to the ceramic-metal composite portion. According to another embodiment, the ceramic filter element can include porous alumina having an open porosity of from about 30 volume percent to about 50 volume percent and the metal can include copper metal. The copper metal can also include an infiltration additive, such as an infiltration additive selected from the group of oxygen and titanium. When oxygen is used as an infiltration additive, it is preferably added in an amount from about 1.5 weight percent to about 10 weight percent. When titanium is used as an infiltration additive, it is preferably added in an amount from about 1 weight percent to about 10 weight percent. The porous ceramic support can have an average pore size of from about 6 micrometers to about 12 micrometers.

According to another aspect of the present invention, a method for sealing the end of a ceramic-based filter element is provided. The method can include the steps of placing a metal in a refractory vessel, heating the metal to a temperature in excess of the melting temperature of the metal such that the metal is in the form of a molten pool having a top surface, contacting a cylindrical ceramic filter element having a first end and a second end and a plurality of channels therethrough with the top surface of the molten pool for a time sufficient to infiltrate a portion of the sintered ceramic filter element, removing the sintered ceramic filter element from contact with the molten pool, cooling the metal-infiltrated portion to form a ceramic filter element having a ceramic-metal composite portion and attaching a metal seal ring to the ceramic-metal composite portion.

According to certain embodiments of this aspect of the invention, the attaching step can include the step of brazing a seal ring to a ceramic-metal composite with a brazing alloy. The brazing alloy can include a copper-silver alloy. In one embodiment, the metal seal ring is a stainless steel ring.

According to another aspect of the present invention, a method for sealing the end of a porous ceramic filter element is provided. This method can include the steps of providing a porous ceramic filter element having a first end and a second end and comprising a plurality of channels therethrough, providing a metal seal ring located around the perimeter of the first end of the filter element, contacting the first end of the filter element with a molten reactive braze metal to infiltrate a portion of the first end with the reactive braze metal and cooling the reactive braze metal to form a seal between the filter element and the seal ring. Preferably, the reactive braze metal comprises titanium.

In yet another aspect of the present invention, a ceramic filter element for a filtration device is provided. The ceramic filter element includes a substantially cylindrically ceramic porous support having channels therethrough, a membrane layer coated on at least a portion of said channels in said porous ceramic support and a metal infiltrated into a portion of the cylindrical ceramic filter element to form a ceramic-metal composite therein.

According to certain embodiments of this aspect of the invention, the filter element includes alumina ceramic. The filter element can have an open porosity of from about 30 volume percent to about 50 volume percent. Further, the filter element can include a stainless steel ring attached to the ceramic-metal composite portion.

BRIEF DESCRIPTION OF THE DRAWINGS

FIG. 1 illustrates a ceramic filter element according to one embodiment of the present invention.

FIG. 2 illustrates a ceramic filter element according to one embodiment of the present invention.

FIG. 3 illustrates a ceramic filter element according to one embodiment of the present invention that has been infiltrated with a metal to seal an end of the filter.

FIG. 4 illustrates a filter element according to one embodiment of the present invention that has been infiltrated with a metal to seal an end of the filter and has a metal ring brazed to the sealed end.

DESCRIPTION OF PREFERRED EMBODIMENTS

The present invention is directed to a method for sealing the end of a ceramic filter element by infiltrating a metal into the end of the filter element to form a ceramic-metal composite at the end. The composite at the end of the filter element creates a substantially hermetic seal within the porous support and a metal ring can be attached to the composite in preparation for placement into a filtration device.

Ceramic filter elements typically have a cylindrical configuration, such as that illustrated in FIG. 1, although other configurations are possible. Referring to FIG. 1, a cross-flow filter element 110 is illustrated as a cylinder including a plurality of channels 120 that run through the length of the filter element 110 and are substantially parallel to the cylinder and one another. During use, the substance to be filtered passes into a first (upstream) end 130 of the filter element 110 and a portion of the filtrate passes through the sidewalls 140 of the filter element 110 due to a pressure differential.

As is illustrated by the cut-away portion of FIG. 1, the channels 120 are coated on their interior surface 150 with a membrane. Thus, before the filtrate reaches the porous support 160 of the filter element 110, the filtrate must pass through the membrane layer coated on the walls of 150 of the channels 120.

The ceramic porous support can be chosen from any of a number of metal oxides, carbides, nitrides or the like. For instance, the ceramic can comprise alumina ($Al_2O_3$), cordierite ($2MgO.2Al_2O_3.5SiO_2$), titania ($TiO_2$), zinc oxide (ZnO), zirconia ($ZrO_2$), iron oxide ($Fe_2O_3$), magnesia (MgO), silica ($SiO_2$), or any other metal oxide. Further, non-oxide ceramics such as silicon carbide (SIC), silicon nitride ($Si_3N_4$), aluminum nitride (AlN) or titanium diboride ($TiB_2$) can be used as the ceramic support material. According to one embodiment of the present invention, alumina is preferred since porous alumina supports can be easily formed and processed into various shapes. Further, alumina maintains good strength and structural integrity in a variety of conditions.

The porous support of the ceramic filter element is a sintered, coherent ceramic body that has substantially continuous open porosity. The porous support preferably has an apparent open porosity of from about 10 volume percent to about 90 volume percent, more preferably from about 30 volume percent to about 50 volume percent. The open porosity preferably has an average apparent diameter of from about 6 micrometers to about 12 micrometers.

The porous support can be formed in a number of ways known to those skilled in the art. For example, porous ceramics can be formed by incorporating pore formers into the ceramic batch. Pore formers are materials that have a volatilization temperature that is lower than the sintering temperature of the ceramic. Upon sintering, the material volatilizes, leaving behind open pore space. Examples of such materials include walnut shells and latex spheres.

Porous ceramics can also be produced by controlling the starting particle size of the ceramic raw materials, the sintering aids and the sintering temperature used to densify the ceramic. For example, porous alumina can be formed by blending alumina particles having particle size of about 10 micrometers. The particles are formed into a cohesive plastic mass and extruded through a die to form a green body having channels therethrough. The green body is then sintered at a temperature of about 1640° C. to form a sintered ceramic porous support. This sintering temperature is somewhat below the normal sintering temperature for obtaining dense alumina so that a porous structure can be obtained.

The porous support has at least one channel running through the interior of the filter and preferably has a plurality of channels. The channels can be formed by a number of techniques known to those skilled in the art, such as incorporating temporary channel molds that are removable after sintering or forming the channels during extrusion of the ceramic body out of an extrusion die, as is discussed above.

After sintering, the ceramic porous support is then treated to adhere one or more membrane layers to the channels of the porous support to form a filter element. The membrane layers are the primary filtering layers for separation of materials. A membrane layer typically includes a dispersion of particles having a controlled particle size and particle size distribution. The particles can be dispersed in a liquid medium which is slip cast, dip-coated or spray-coated onto the channels of the porous ceramic support. The membrane particles can have a similar ceramic composition as the porous support or can have a different composition. It is preferred, however, that the membrane layer be made from ceramic materials to maintain corrosion and heat resistance. The porosity and pore size of the membrane is controlled by the size of the membrane particles and the temperature and time of sintering after the porous support is coated with the membrane.

The membrane layer can include a plurality of layers having different particle sizes for different applications. Each individual layer can be applied, for example, by immersing the tube in a liquid suspension and drawing a vacuum through the inner diameter of the tube. Alternatively, the slurry containing the membrane particles can be pumped through the tube under pressure or can be slip-cast into the tube.

According to one preferred embodiment of the present invention, the membrane includes three different layers. A first layer is applied to the channels by slip-casting a slurry having alumina particles with an average diameter of about 3 micrometers and this layer is sintered at about 1430° C. to form an adhered first layer having an average pore size of about 0.8 micrometers. A second layer is then applied by slip-casting alumina particles onto the first layer having an average particle size of about 0.5 micrometers. This layer is sintered at about 1000° C. to form a second adhered layer having an average pore size of about 0.2 micrometers. Finally, a third layer can be applied as a sol-gel and can be sintered at about 650° C. to form a third layer having an average pore size of, for example, about 40 Angstroms.

According to the present invention, when a filter element having the desired properties is obtained, molten metal can be infiltrated into the open porosity of the filter element to internally seal the filter element. The metal infiltrates the porous support without substantially clogging or filling the filter channels. The metal can be infiltrated into the ceramic filter element either before or after the membrane layer has been adhered to the porous support. It may be advantageous to infiltrate the metal into the filter element before applying the membrane layers since the molten metal may preferentially infiltrate the membrane layer due to the smaller pore size of the porosity in the membrane layer.

The infiltrant metal can be selected from any metal whose melting point is below the melting point of the ceramic matrix material. For example, copper (Cu), nickel (Ni), aluminum (Al) or alloys thereof can be used for the infiltrating metal. A preferred metal is copper, since it has been found that copper readily infiltrates into an alumina ceramic filter element. Other metals may be preferred, depending on the anticipated end use of the filter.

In a preferred embodiment of the present invention, an end of the ceramic filter element is brought into contact with the molten metal and the metal infiltrates the ceramic by capillary action without the assistance of any substantial overpressure. As used herein, the term "substantial overpressure" refers to a pressure in excess of about 3 atmospheres (about 45 psi) applied during the infiltration process, either mechanically or through the use of pressurized gas.

Upon infiltration, the molten metal enters the pore structure of the ceramic filter element and fills substantially all of the void space, up to a certain height. The distance that the metal infiltrates into the filter element can be controlled by controlling the amount of molten metal that is available to infiltrate or by controlling the amount of time that the filter element is in contact with the molten metal.

Infiltration additives can also be used when such additives are not substantially detrimental to the resulting seal in the filter element. For example, to improve capillary action between the ceramic and the molten metal, it may be desirable to modify the wetting or spreading characteristics of the ceramic and metal. One way to do this is to coat the open porosity of the ceramic filter element with a coating that is more easily wetted by the molten metal. For instance, the surfaces of alumina or magnesia ceramic can be modified by vapor phase coating the ceramic with copper oxide or nickel oxide to enhance the infiltration of copper metal into the porous support.

Another way of enhancing the wetting characteristics is to modify the chemical composition of the molten metal with an infiltration additive. For instance, the wetting of molten copper on alumina can be enhanced by the addition of oxygen to the copper or with the addition of titanium (Ti). Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent. When titanium is used as an infiltration additive, it is preferably added in an amount of from about 1 weight percent to about 10 weight percent.

After one or more of the surface modifications and chemical modification noted above, if necessary, the molten metal will wet the ceramic and infiltrate the open porosity of the ceramic filter element through capillary action.

Although a vacuum atmosphere is not necessary, the metal infiltration step is preferably performed in a vacuum atmosphere. As used herein, vacuum atmosphere refers to an atmospheric pressure of about 10 millitorr or less. The evacuation of air from the ceramic void space reduces the likelihood that air pockets will form be entrapped in the composite.

The temperature at which infiltration takes place is dependent on the ceramic and molten metal used. In one embodiment, an alumina ceramic with a 3 micrometer average pore size is infiltrated at 1250° C. with copper having about 3 weight percent oxygen added as an infiltration additive. The total time required for infiltration of a filter element is very short and can typically occur in less than about 1 minute.

The filter element is preferably heated to at least the melting temperature of the infiltrant metal prior to infiltration. If the ceramic filter element is too cool, the molten metal may selectively solidify as it infiltrates the ceramic filter element and may prevent further infiltration due to the solidification.

After the metal has been infiltrated into an end of the filter element and has cooled, the filter element can then be connected to a supporting metallic ring. For example, it is often necessary to connect the filter element to a supporting stainless steel ring which is later connected to the filtration apparatus.

According to one embodiment of the present invention, the metal infiltrated filter element is brazed to a metal ring, such as a stainless steel ring. The metal ring is brought into proximity with the filter element such that the ring surrounds the ceramic-metal composite portion and a braze metal is placed between the stainless steel ring and the composite portion. When the braze is heated, it wets both the stainless steel ring and the ceramic-metal composite portion and, upon cooling, forms a tight hermetic bond to both articles. According to one embodiment of the present invention, the infiltrated metal is copper metal, the ring is stainless steel and the braze is a copper/silver brazing alloy.

In an alternative embodiment of the present invention, a reactive braze is infiltrated into the ceramic filter element such that the reactive braze simultaneously adheres to the stainless steel ring. For example, a copper/silver/titanium alloy can be heated to above its melting point and infiltrated into the ceramic while the metal ring is placed around the filter element. Upon cooling, a hermetic seal is formed between the metal ring and the metal-infiltrated ceramic.

The foregoing embodiments are generally illustrated in FIGS. 2–4. FIG. 2 illustrates a filter element 210 according to the present invention. The filter element 210 includes a plurality of filtering channels 220 extending through the length of the filter element 210. FIG. 3 illustrates a filter element 310 wherein the porous support portion 360 has been infiltrated at the lower end 370 with a metal 380. Although, as illustrated in FIG. 3, it appears that the metal is discontinuous, the metal is in fact continuous and forms a solid surface around the perimeter of the filter element 310. However, the molten metal does not enter the channels 220, which remain free of obstruction.

FIG. 4 illustrates the filter element 410 wherein a ring 490 has been attached to the lower end of the filter element 410. The filter element 410 having the ring 490 attached can now be placed into a filtration device. Although not illustrated, the ceramic filter element can have a composite infiltrated end and a metal ring attached to both ends of the filter element.

The sealed filter element according to the present invention provides a number of advantages over the prior art. The metal ring is hermetically attached to the filter element without the need for organic o-rings or other similar techniques that may leak due to gaps in the seal. The seal according to the present invention will work for a wide variety of filtration devices including those devices used for separating particles in the ultrafiltration range. Further, the operating temperature will only be limited by the melting temperature of the metal infiltrated into the ceramic.

EXAMPLE

A porous support for a ceramic filter element having an apparent porosity of about 40 volume percent and a pore diameter range of from about 6 micrometers to about 10 micrometers is provided. The porous support is alumina and the channels are coated with an alumina membrane for separation of particles in the 0.2 to 0.8 micrometer size range. The filter element is cylindrical with 12 channels running the length of the cylinder. The cylinder has a diameter of about 1 inch (2.5 centimeters) and a length of about 39 inches (100 centimeters).

A molten metal bath is prepared for infiltrating into the filter element. The metal comprises copper metal and includes 3 weight percent copper oxide as an infiltration enhancer. The metal is heated to about 1275° C. until the metal is molten. While under a vacuum, the filter element is heated to about 1275° C. and one end of the filter element is contacted with the metal bath for less than one minute and the copper infiltrates that end of the filter to a height of about 1 inch (2.5 centimeters).

The filter element is then cooled to solidify the copper metal and seal the end of the filter element. Thereafter, a stainless steel ring is brazed onto the end of the filter using a copper/silver braze having about 30 weight percent silver.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for sealing an end of a ceramic filter element, comprising the steps of:
   a) providing a porous ceramic filter element comprising a first portion and a second end portion and comprising filtering channels therethrough wherein said filter element comprises a substantially continuous network of open porosity;
   b) contacting a portion of said first end of said filter element with a molten metal to infiltrate said metal into the continuous network of open porosity in said first end portion of said filter element without substantially infiltrating said filtering channels;
   c) cooling said infiltrated portion to form a filter element having an internally sealed end comprising a ceramic-metal composite portion; and
   d) attaching a metal seal ring to said ceramic-metal composite portion.

2. A method a recited in claim 1, wherein said step of attaching a metal seal ring to said ceramic-metal composite portion comprises the step of brazing said seal ring to said ceramic-metal composite portion.

3. A method as recited in claim 1, wherein said porous ceramic filter element comprises porous alumina having an open porosity of from about 30 volume percent to about 50 volume percent and said molten metal comprises copper metal.

4. A method as recited in claim 3 wherein said copper metal comprises an infiltration additive.

5. A method as recited in claim 4, wherein said infiltration additive is selected from the group consisting of oxygen and titanium.

6. A method as recited in claim 3, wherein said molten metal comprises copper and from about 1.5 weight percent to about 10 weight percent oxygen.

7. A method as recited in claim 1, wherein said ceramic filter element comprises a porous ceramic support having from about 30 volume percent to about 50 volume percent open porosity.

8. A method as recited in claim 7, wherein said porous ceramic support has an average pore size of from about 6 micrometers to about 12 micrometers.

9. A method as recited in claim 1, further comprising the step of coating at least a portion of said filtering channels with a membrane layer.

10. A method for sealing an end of a ceramic-based filter element, comprising the steps of:

(a) placing a metal in a refractory vessel;

(b) heating said metal to a temperature in excess of the melting temperature of said metal such that said metal is in the form of a molten pool having a top surface;

(c) contacting a sintered cylindrical ceramic filter element having a first end and a second end and comprising a plurality of channels therethrough with said top surface of said molten pool for a time sufficient to infiltrate a portion of said sintered ceramic filter element;

(d) removing said sintered ceramic filter element from contact with said molten pool;

(e) cooling said metal-infiltrated portion to form a ceramic filter element having a ceramic-metal composite portion;

(f) attaching a metal seal ring to said ceramic-metal composite portion.

11. A method as recited in claim 10, wherein said attaching step comprises the step of brazing said seal ring to said ceramic-metal composite with a brazing alloy.

12. A method as recited in claim 11, wherein said brazing alloy is a copper-silver alloy.

13. A method as recited in claim 12, wherein said metal seal ring is a stainless steel ring.

14. A method for sealing an end of a porous ceramic filter element, comprising the steps of:

(a) providing a porous ceramic filter element having a first end and a second end and comprising a plurality of channels therethrough;

(b) providing a metal seal ring located around a perimeter of said first end of said filter element;

(c) contacting said first end of said ceramic filter element with molten reactive braze metal to infiltrate a portion of said first end with said reactive braze metal; and (d) cooling said reactive braze metal to form a seal between said filter element and said seal ring.

15. A method as recited in claim 14, wherein said reactive braze metal comprises titanium.

16. A ceramic filter element for a filtration device, comprising:

a) a substantially cylindrical sintered ceramic porous support having channels therethrough;

b) a membrane layer coated on at least a portion of said channels in said porous ceramic support;

c) a metal infiltrated into an end portion of said ceramic filter element to form a ceramic-metal composite portion wherein said ceramic metal composite portion creates a substantially hermetic internal seal within said porous support and wherein said channels are not substantially filled with said metal; and d) a stainless steel ring attached to said ceramic-metal composite portion.

17. A filter element as recited in claim 16, wherein said filter element comprises alumina ceramic.

18. A filter element as recited in claim 16, wherein said filter element has an open porosity of from about 30 volume percent to about 50 volume percent.

19. A method for sealing an end of a ceramic filter element, comprising the steps of:

(a) providing a porous ceramic filter element having a first end and a second end and comprising filtering channels therethrough;

(b) contacting a portion of said first end of said filter element with a molten metal to infiltrate said metal into said first end of said filter element;

(c) cooling said infiltrated portion to form a filter element having a sealed end comprising a ceramic-metal composite portion; and (d) attaching a metal seal ring to said ceramic-metal composite portion.

20. A ceramic filter element for a filtration device, comprising:

(a) a sintered ceramic porous support having channels therethrough;

(b) a membrane layer coated on at least a portion of said channels in said porous ceramic support to form a ceramic filter element;

(c) a metal infiltrated into a portion of said ceramic filter element to form a ceramic-metal composite portion; and (d) a metal ring attached to said ceramic-metal composite portion.

21. A filter element as recited in claim 20, wherein said metal ring is a stainless steel ring.

* * * * *